(12) United States Patent
Miyamoto

(10) Patent No.: US 9,029,209 B2
(45) Date of Patent: May 12, 2015

(54) METHOD OF MANUFACTURING A THIN FILM TRANSISTOR SUBSTRATE AND THIN FILM TRANSISTOR SUBSTRATE MANUFACTURED BY THE SAME

(75) Inventor: Mitsunobu Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 44 days.

(21) Appl. No.: 13/877,465

(22) PCT Filed: Oct. 11, 2011

(86) PCT No.: PCT/JP2011/005681
§ 371 (c)(1),
(2), (4) Date: Apr. 3, 2013

(87) PCT Pub. No.: WO2012/053161
PCT Pub. Date: Apr. 26, 2012

(65) Prior Publication Data
US 2013/0187155 A1    Jul. 25, 2013

(30) Foreign Application Priority Data

Oct. 18, 2010   (JP) ................................ 2010-233395

(51) Int. Cl.
| | |
|---|---|
| H01L 21/00 | (2006.01) |
| H01L 21/84 | (2006.01) |
| H01L 29/66 | (2006.01) |
| H01L 29/786 | (2006.01) |

(52) U.S. Cl.
CPC .... *H01L 29/66742* (2013.01); *H01L 29/78606* (2013.01); *H01L 29/78693* (2013.01); *H01L 29/7869* (2013.01); *H01L 29/66969* (2013.01)

(58) Field of Classification Search
USPC .......... 438/23, 104, 158; 257/57–59, E21.46, 257/E21.414, E29.296, E33.053
See application file for complete search history.

(56) References Cited

U.S. PATENT DOCUMENTS

| | | | |
|---|---|---|---|
| 2006/0043447 A1* | 3/2006 | Ishii et al. | ...................... 257/295 |
| 2010/0127253 A1* | 5/2010 | Inoue et al. | ...................... 257/43 |
| 2010/0127266 A1 | 5/2010 | Saito et al. | |
| 2012/0058601 A1 | 3/2012 | Saito et al. | |
| 2012/0132909 A1 | 5/2012 | Saito et al. | |

FOREIGN PATENT DOCUMENTS

JP         2010-123748 A       6/2010

OTHER PUBLICATIONS

Official Communication issued in International Patent Application No. PCT/JP2011/005681, mailed on Jan. 10, 2012.

* cited by examiner

*Primary Examiner* — Charles Garber
*Assistant Examiner* — Abdulfattah Mustapha
(74) *Attorney, Agent, or Firm* — Keating & Bennett, LLP

(57) ABSTRACT

A method of manufacturing a thin film transistor substrate (1) includes at least the steps of: forming a gate electrode (15) on an insulating substrate (10) by using a first photomask; forming a channel protective film (21) on an oxide semiconductor layer (13) so as to cover a channel region (C) by using a second photomask; forming a source electrode (19) on the oxide semiconductor layer (13) by using a third photomask; and forming a planarizing film (18) on an interlayer insulating film (17) by using a fourth photomask.

12 Claims, 7 Drawing Sheets

METHOD OF MANUFACTURING A THIN FILM TRANSISTOR SUBSTRATE AND THIN FILM TRANSISTOR SUBSTRATE MANUFACTURED BY THE SAME

TECHNICAL FIELD

The present invention relates to methods of manufacturing a thin film transistor substrate, and more particularly to methods of manufacturing a thin film transistor substrate using a semiconductor layer of an oxide semiconductor, and thin film transistor substrates manufactured by the same.

BACKGROUND ART

In active matrix substrates, a thin film transistor (hereinafter also referred to as the "TFT"), for example, is provided as a switching element in each pixel as a minimum unit of an image.

Typical bottom gate TFTs include, e.g., a gate electrode provided on an insulating substrate, a gate insulating film provided so as to cover the gate electrode, a semiconductor layer formed in an island shape on the gate insulating film so as to overlap the gate electrode, and source and drain electrodes provided on the semiconductor layer so as to face each other.

In recent years, in active matrix substrates, TFTs using a semiconductor layer of an oxide semiconductor (hereinafter also referred to as the "oxide semiconductor layer") comprised of an In—Ga—Zn—O (IGZO) oxide semiconductor film with high mobility have been proposed as switching elements of pixels as a minimum unit of an image, instead of conventional thin film transistors using a semiconductor layer of amorphous silicon.

More specifically, for example, a thin film transistor substrate has been disclosed which includes an insulating layer, a gate electrode provided on the insulating layer, an oxide semiconductor layer provided on the gate electrode with a gate insulating film interposed therebetween, source and drain electrodes provided on the oxide semiconductor layer so as to be separated from each other with the gate electrode interposed therebetween, and a channel protective film provided between the source and drain electrodes and the oxide semiconductor layer so as to cover at least a part of a side surface of the oxide semiconductor layer which is exposed from the source and drain electrodes over the gate electrode.

In order to manufacture this thin film transistor substrate, the steps of forming a gate electrode on a substrate, forming a gate insulating film on the gate electrode, forming an oxide semiconductor layer on the gate insulating film, and forming a channel protective film so as to cover at least a part of a side surface of the oxide semiconductor layer over the gate electrode are first performed. Next, the step of heating the oxide semiconductor layer and the channel protective film at a temperature of 160° C. or higher, and then forming source and drain electrodes on the oxide semiconductor layer and the channel protective film is performed. The thin film transistor substrate is manufactured by using five photomasks (see, e.g., Patent Document 1).

CITATION LIST

Patent Document

PATENT DOCUMENT 1: Japanese Patent Publication No. 2010-123748

SUMMARY OF THE INVENTION

Technical Problem

However, since the method of manufacturing a thin film transistor substrate described in Patent Document 1 uses five photomasks as described above, the number of steps in the manufacturing process is increased, which increases manufacturing cost and reduces yield.

The present invention was developed in view of the above problems, and it is an object of the present invention to provide a method of manufacturing a thin film transistor substrate, which is capable of manufacturing a thin film transistor substrate with a smaller number of masks than conventional examples, and a thin film transistor substrate manufactured by this method.

Solution to the Problem

In order to achieve the above object, a first method of manufacturing a thin film transistor substrate according to the present invention is a method of manufacturing a thin film transistor substrate that includes an insulating substrate, a thin film transistor having a gate electrode provided on the insulating substrate, a gate insulating film provided so as to cover the gate electrode, an oxide semiconductor layer provided on the gate insulating film and having a channel region, and a source electrode provided on the oxide semiconductor layer so as to overlap the gate electrode, a channel protective film provided so as to cover the channel region, an interlayer insulating film provided so as to cover the thin film transistor, and a planarizing film provided so as to cover the interlayer insulating film, including at least: a gate electrode formation step of forming the gate electrode on the insulating substrate by using a first photomask; a gate insulating film formation step of forming the gate insulating film over the insulating substrate so as to cover the gate electrode; a semiconductor layer formation step of forming the oxide semiconductor layer on the gate insulating film; a channel protective film formation step of forming the channel protective film on the oxide semiconductor layer so as to cover the channel region by using a second photomask; a source electrode formation step of forming the source electrode on the oxide semiconductor layer by using a third photomask; an interlayer insulating film formation step of forming the interlayer insulating film covering the oxide semiconductor layer, the channel protective film, and the source electrode; a planarizing film formation step of forming the planarizing film on the interlayer insulating film by using a fourth photomask; an opening formation step of forming an opening in the interlayer insulating film and the planarizing film by removing a part of the interlayer insulating film by using the planarizing film as a mask; a channel protective film removal step of removing the channel protective film in the opening by performing etching by using the interlayer insulating film and the planarizing film as a mask; and a plasma treatment step of plasma treating the oxide semiconductor layer in the opening.

With this configuration, the thin film transistor can be manufactured by using fewer masks (four masks) than the related art described above, whereby manufacturing cost can be reduced, and reduction in yield can be effectively suppressed.

Since a halftone exposure technique is not used, the thin film transistor substrate can be manufactured by using fewer masks (four masks) than the related art described above, without causing difficulty in forming fine patterns.

A second method of manufacturing a thin film transistor substrate according to the present invention is a method of manufacturing a thin film transistor substrate that includes an insulating substrate, a thin film transistor having a gate electrode provided on the insulating substrate, a gate insulating film provided so as to cover the gate electrode, an oxide semiconductor layer provided on the gate insulating film and having a channel region, and a source electrode provided on the oxide semiconductor layer so as to overlap the gate electrode, a channel protective film provided so as to cover the channel region, and an interlayer insulating film provided so as to cover the thin film transistor, including at least: a gate electrode formation step of forming the gate electrode on the insulating substrate by using a first photomask; a gate insulating film formation step of forming the gate insulating film over the insulating substrate so as to cover the gate electrode; a semiconductor layer formation step of forming the oxide semiconductor layer on the gate insulating film; a channel protective film formation step of forming the channel protective film on the oxide semiconductor layer so as to cover the channel region by using a second photomask; a source electrode formation step of forming the source electrode on the oxide semiconductor layer by using a third photomask; an interlayer insulating film formation step of forming the interlayer insulating film covering the oxide semiconductor layer, the channel protective film, and the source electrode and having an opening by using a fourth photomask; a channel protective film removal step of removing the channel protective film in the opening by performing etching by using the interlayer insulating film as a mask; and a plasma treatment step of plasma treating the oxide semiconductor layer in the opening.

With this configuration, the thin film transistor can be manufactured by using fewer masks (four masks) than the related art described above, whereby manufacturing cost can be reduced, and reduction in yield can be effectively suppressed.

Since the halftone exposure technique is not used, the thin film transistor substrate can be manufactured by using fewer masks (four masks) than the related art described above, without causing difficulty in forming fine patterns.

In the first or second method of manufacturing a thin film transistor substrate according to the present invention, a reducing plasma treatment may be performed as the plasma treatment.

With this configuration, a drain electrode and a pixel electrode, for example, can be formed by plasma treating the oxide semiconductor layer by a simple method without using a separate mask.

In the first or second method of manufacturing a thin film transistor substrate according to the present invention, a metal oxide material containing at least one selected from the group consisting of indium (In), gallium (Ga), aluminum (Al), copper (Cu), and zinc (Zn) may be used as an oxide semiconductor material forming the oxide semiconductor layer.

With this configuration, since the oxide semiconductor layer comprised of such a material has high mobility even if it is amorphous, the on-state resistance of a switching element can be increased.

In the first or second method of manufacturing a thin film transistor substrate according to the present invention, indium gallium zinc oxide (IGZO) may be used as the oxide semiconductor material.

With this configuration, the thin film transistor can have satisfactory characteristics such as high mobility and a low off-state current.

A thin film transistor substrate according to the present invention is a thin film transistor substrate manufactured by the first or second method of manufacturing a thin film transistor substrate according to the present invention.

Advantages of the Invention

According to the present invention, a thin film transistor substrate can be provided which can reduce manufacturing cost and can effectively suppress reduction in yield.

DESCRIPTION OF EMBODIMENTS

An embodiment of the present invention will be described in detail below with reference to the accompanying drawings. The present invention is not limited to the following embodiment.

Figure 1:
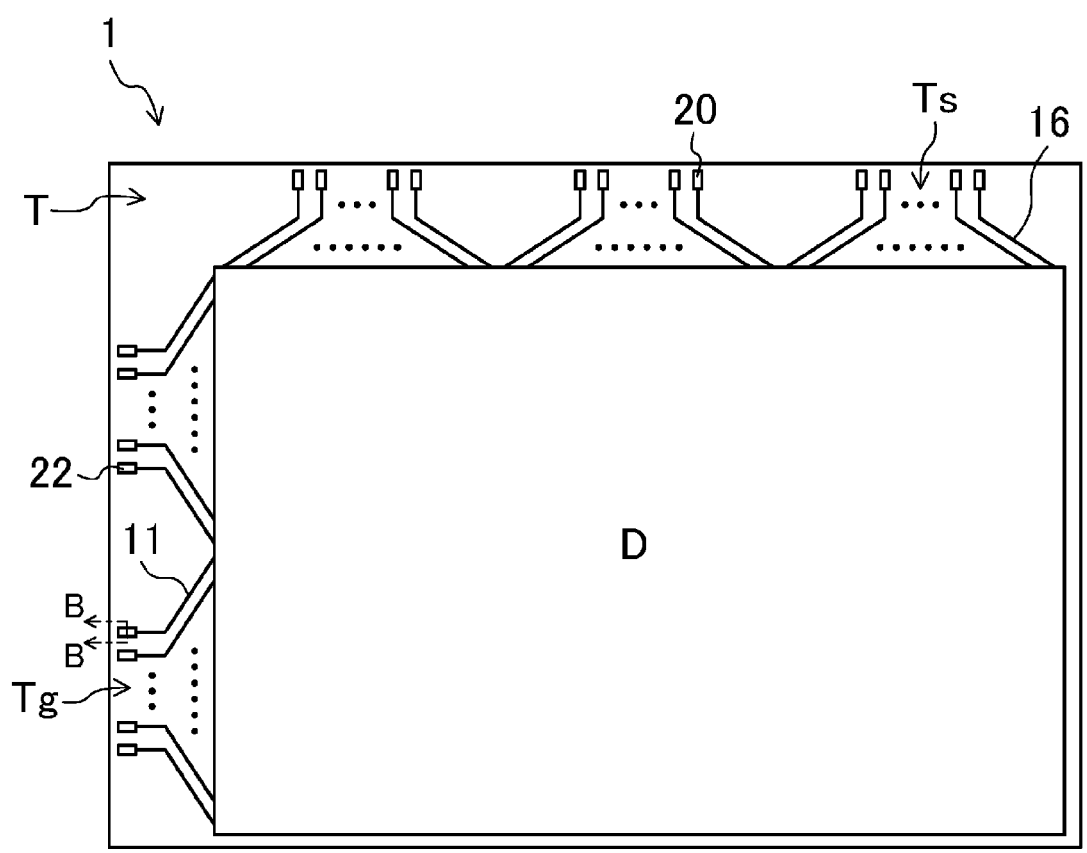
FIG. 1 is a plan view of a thin film transistor substrate according to an embodiment of the present invention.
Figure 2:
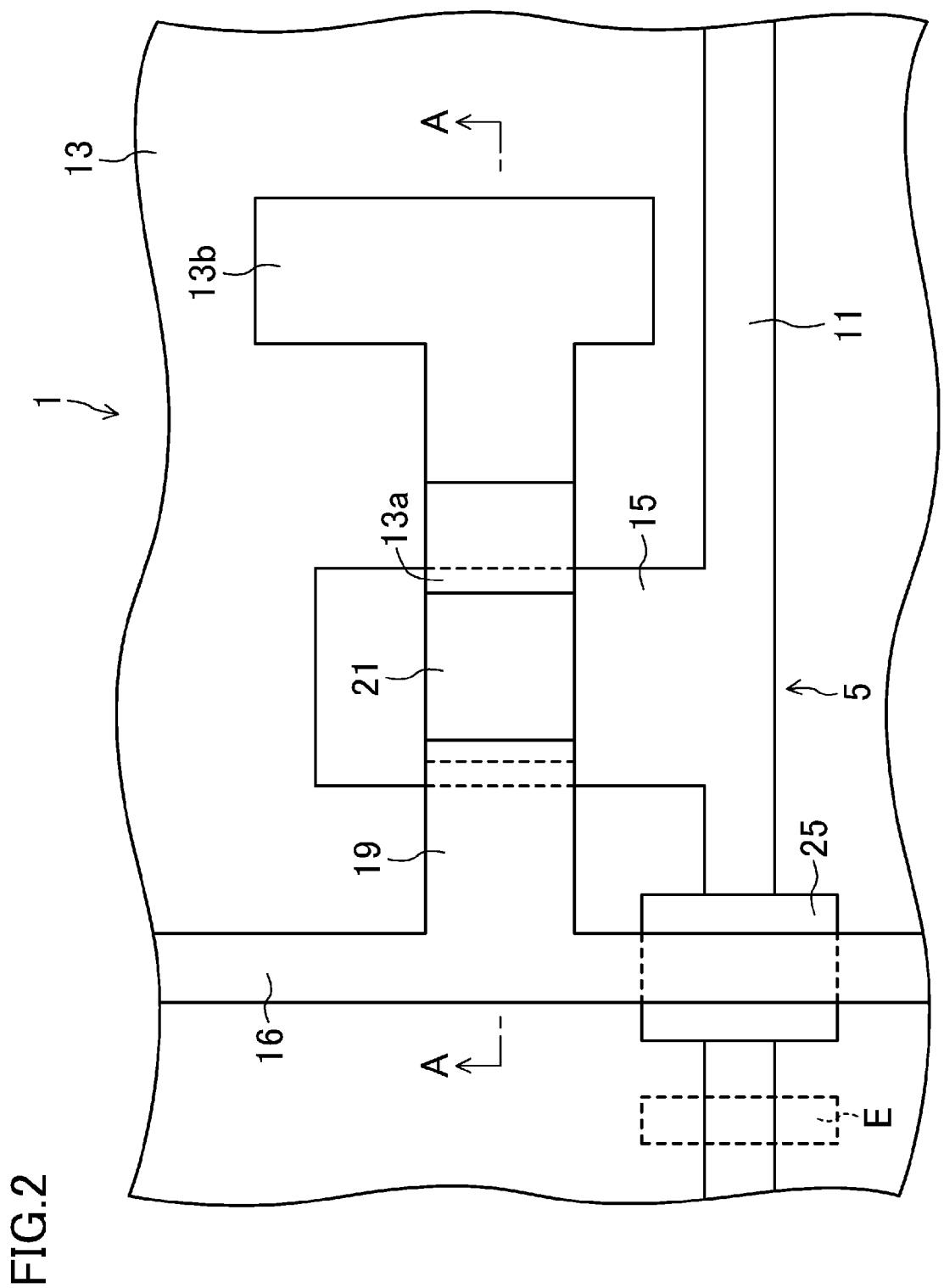
FIG. 2 is an enlarged plan view of a pixel portion of the thin film transistor substrate according to the embodiment of the present invention.
Figure 3:
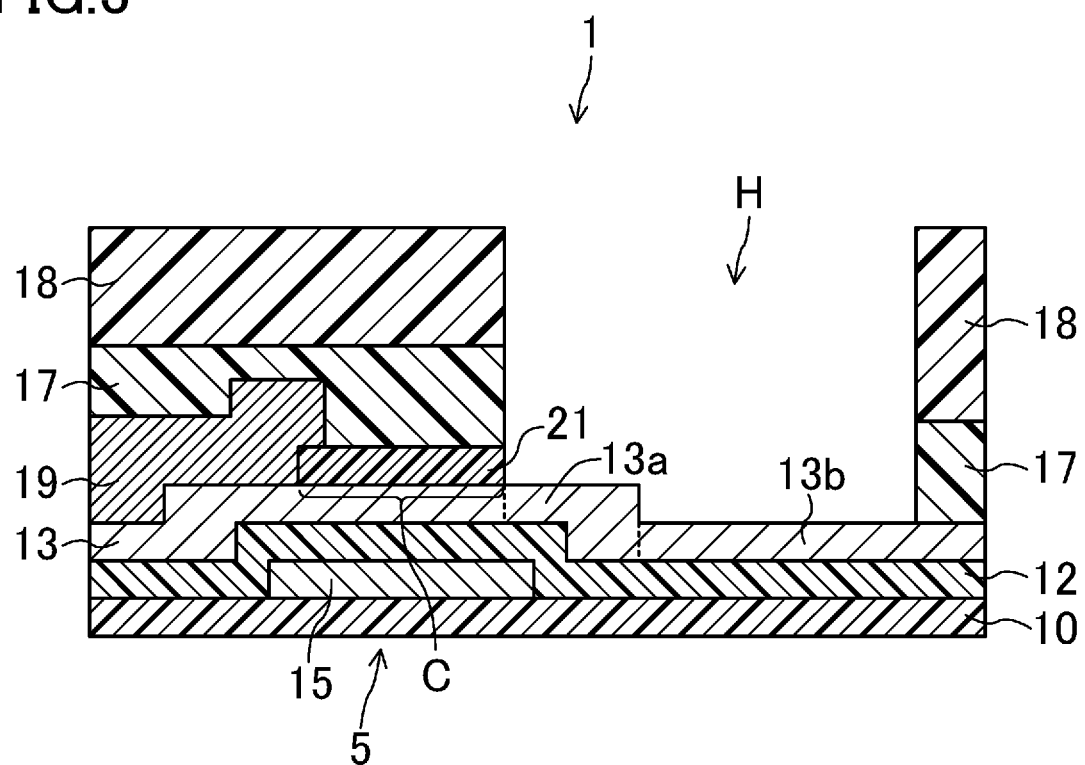
FIG. 3 is a sectional view of the thin film transistor substrate according to the embodiment of the present invention, taken along line A-A in FIG. 2.
Figure 4:
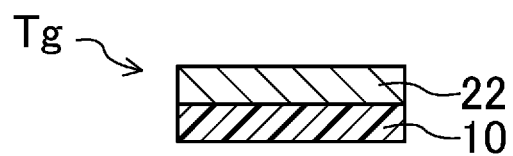
FIG. 4 is a sectional view of a terminal (gate terminal) of the thin film transistor substrate according to the embodiment of the present invention, taken along line B-B in FIG. 1.

FIG. 1 is a plan view of a thin film transistor substrate according to an embodiment of the present invention, and FIG. 2 is an enlarged plan view of a pixel portion of the thin film transistor substrate according to the embodiment of the present invention. FIG. 3 is a sectional view of the thin film transistor substrate according to the embodiment of the present invention, taken along line A-A in FIG. 2. FIG. 4 is a sectional view of a terminal (gate terminal) of the thin film transistor substrate according to the embodiment of the present invention, taken along line B-B in FIG. 1.

As shown in FIG. 1, a thin film transistor substrate 1 includes a display region D configured to display an image, and a drive circuit region T provided around the display region D. This drive circuit region T includes a gate driver region Tg and a source driver region Ts. A gate driver (not shown) configured to drive gate lines (scanning lines) 11 in the display region D is provided in the gate driver region Tg, and a source driver (not shown) configured to drive source lines (signal lines) 16 in the display region D is provided in the source driver region Ts.

As shown in FIG. 1, the gate lines 11 are extended to the gate driver region Tg of the drive circuit region T, and are connected to gate terminals 22 in the gate driver region Tg. As shown in FIG. 4, each gate terminal 22 is formed on an insulating substrate 10 in the gate driver region Tg.

As shown in FIG. 1, the source lines 16 are extended to the source driver region Ts of the drive circuit region T as relay lines, and are connected to source terminals 20 in the source driver region Ts. Although not shown in the figure, like the gate terminals 22, the source terminals 20 are formed on the insulating substrate 10 in the source driver region Ts.

As shown in FIGS. 1 to 3, the thin film transistor substrate 1 includes the insulating substrate 10, and in the display region D configured to display an image, further includes the plurality of gate lines 11 provided on the insulating substrate 10 so as to extend parallel to each other, and the plurality of source lines 16 provided over the insulating substrate 10 so as to extend parallel to each other.

As shown in FIG. 3, the thin film transistor substrate 1 includes a thin film transistor 5, an interlayer insulating film (protective film) 17 provided so as to cover the thin film transistor 5, and a planarizing film 18 provided so as to cover the interlayer insulating film 17.

As shown in FIGS. 2 and 3, the thin film transistor 5 includes a gate electrode 15 provided on the insulating substrate 10, a gate insulating film 12 provided so as to cover the gate electrode 15, and an oxide semiconductor layer 13 provided on the gate insulating film 12 and having a channel region C formed in an island shape so as to overlap the gate electrode 15. The thin film transistor 5 includes a channel protective film 21 provided so as to cover the channel region C of the oxide semiconductor layer 13, and a source electrode 19 provided on the oxide semiconductor layer 13 so as to overlap the gate electrode 15.

In the present embodiment, as shown in FIG. 3, an opening H is formed in a stacked film of the interlayer insulating film 17 and the planarizing film 18. The oxide semiconductor layer 13 in the opening H is plasma treated to reduce the resistance of a part of the oxide semiconductor layer 13, so that a part of the oxide semiconductor layer 13 in the opening H functions as a drain electrode 13a and another part of the oxide semiconductor layer 13 in the opening H functions as a pixel electrode 13b. The drain electrode 13a is configured to be connected to the pixel electrode 13b in the opening H.

As shown in FIG. 3, the drain electrode 13a and the source electrode 19 are provided so as to face each other with the channel region C of the oxide semiconductor layer 13 interposed therebetween.

As shown in FIG. 2, the source electrode 19 is a portion of the source line 16 which protrudes in the lateral direction, and the gate electrode 15 is a portion of the gate line 11 which protrudes in the lateral direction.

In the present embodiment, as shown in FIG. 2, a protective layer 25 comprised of the same material as the channel protective film 21 is provided at the intersection of the gate line 11 and the source line 16.

The oxide semiconductor layer 13, the drain electrode 13a, and the pixel electrode 13b are formed by an oxide semiconductor film comprised of, e.g., indium gallium zinc oxide (IGZO) etc.

An example of a manufacturing method of the thin film transistor substrate 1 of the present embodiment will be described below with reference to the drawings. FIGS. 5A-7F are illustrations showing in section a manufacturing process of the thin film transistor substrate according to the embodiment of the present invention.

<Gate Electrode/Gate Line Formation Step>

Figure 5A:
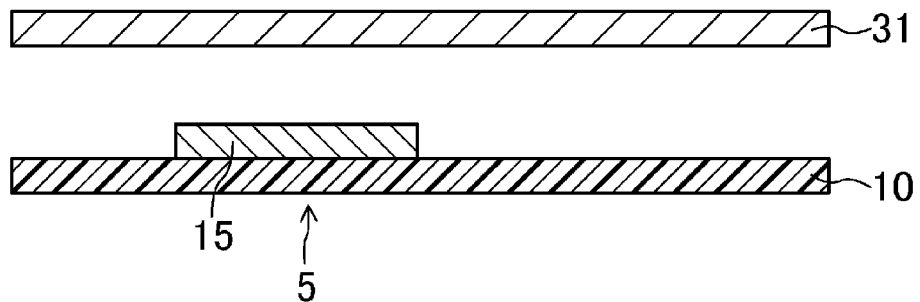
FIGS. 5A-5D are illustrations showing in section a manufacturing process of the thin film transistor substrate according to the embodiment of the present invention.
Figure 7A:
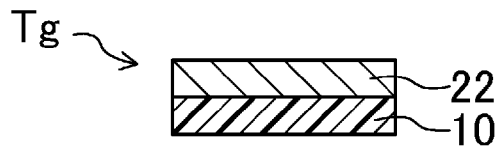
FIGS. 7A-7F are illustrations showing in section the manufacturing process of the thin film transistor substrate according to the embodiment of the present invention.

First, for example, a molybdenum film (thickness: about 150 nm) etc. is formed by a sputtering method on an entire insulating substrate 10 such as a glass substrate or a plastic substrate. Then, the molybdenum film is subjected to resist patterning, wet etching, and resist delamination and cleaning by photolithography using a first photomask 31 having a predetermined pattern shape. A gate line 12 (see FIG. 2), a gate electrode 15, and a gate terminal 22 are thus formed on the insulating substrate 10 as shown in FIGS. 5A and 7A.

Although the molybdenum film having a single layer structure is shown as a metal film forming the gate line 11, the gate electrode 15, and the gate terminal 22 in the present embodiment, the gate line 11, the gate electrode 15, and the gate terminal 22 may be formed with a thickness of 50 nm to 300 nm by, e.g., a metal film such as an aluminum film, a tungsten film, a tantalum film, a chromium film, a titanium film, or a copper film, or a film comprised of an alloy or nitride of such metals.

For example, a polyethylene terephthalate resin, a polyethylene naphthalate resin, a polyether sulfone resin, an acrylic resin, and a polyimide resin can be used as a material that forms the plastic substrate.

<Gate Insulating Film Formation Step>

Figure 5B:
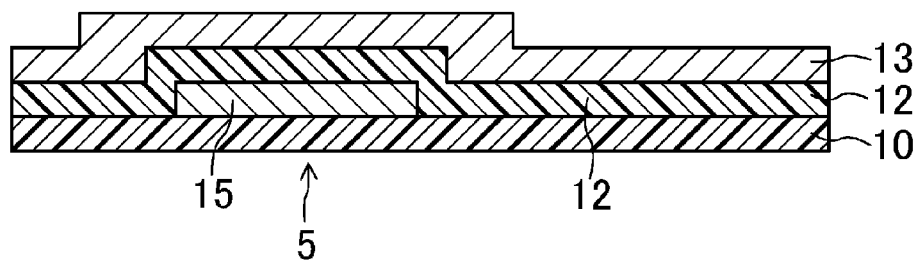
Figure 7B:
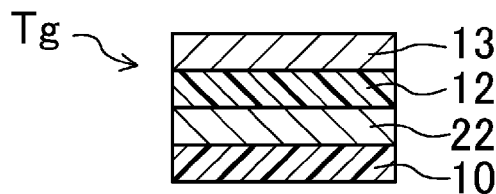

Next, for example, a silicon nitride film (thickness: about 200 nm to 500 nm) is formed by a chemical vapor deposition (CVD) method over the entire substrate on which the gate line 11, the gate electrode 15, and the gate terminal 22 have been formed. A gate insulating film 12 is thus formed over the insulating substrate 10 so as to cover the gate line 11, the gate electrode 15, and the gate terminal 22, as shown in FIGS. 5B and 7B.

The gate insulating film 12 may have a two-layer stacked structure. In this case, for example, a silicon oxide film (SiOx), a silicon oxynitride film (SiOxNy, x>y), a silicon nitride oxide film (SiNxOy, x>y), etc. can be used in addition to the silicon nitride film (SiNx).

In order to prevent diffusion of impurities etc. from the insulating substrate 10, it is preferable to use a silicon nitride film or a silicon nitride oxide film as the lower layer of the gate insulating film, and to use a silicon oxide film or a silicon oxynitride film as the upper layer of the gate insulating film. For example, a silicon nitride film having a thickness of 100 nm to 200 nm can be formed as the lower layer of the gate insulating film by using $SiH_4$ and $NH_3$ as a reactant gas, and a silicon oxide film having a thickness of 50 nm to 100 nm can be used as the upper layer of the gate insulating film by using $N_2O$ and $SiH_4$ as a reactant gas.

In order to form a dense gate insulating film 12 with a low gate leakage current at a low film-formation temperature, it is preferable to add a rare gas such as an argon gas to the reactant gas so that the insulating film contains the rare gas.

<Semiconductor Layer Formation Step>

Then, an oxide semiconductor film (thickness: about 30 nm to 100 nm) comprised of, e.g., indium gallium zinc oxide (IGZO) is formed by a sputtering method to form an oxide semiconductor layer 13 on the gate insulating film 12, as shown in FIGS. 5B and 7B.

The present embodiment is different from the above related art in that the oxide semiconductor film is not subjected to resist patterning, wet etching, and resist delamination and cleaning by photolithography using a photomask.

<Channel Protective Film Formation Step>

Figure 5C:
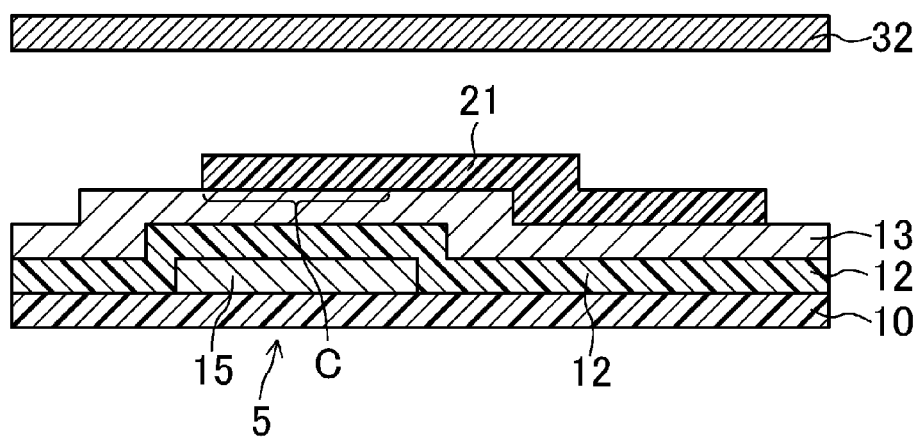

Subsequently, for example, a silicon nitride film, a silicon oxide film, a silicon nitride oxide film, etc. is formed by a plasma CVD method on the entire substrate on which the oxide semiconductor layer 13 has been formed. Then, the silicon nitride film etc. is subjected to resist patterning, wet etching, and resist delamination and cleaning by photolithography using a second photomask 32 having a predetermined pattern shape. A channel protective film 21 configured to protect a channel region C is thus formed on the oxide semiconductor layer 13 so as to cover the channel region C, as shown in FIG. 5C.

For example, a silicon oxide film having a thickness of 100 nm to 200 nm can be formed as the channel protective film 21 by using $SiH_4$ and $N_2O$ as a reactant gas. The protective film 25 described above (see FIG. 2) is formed simultaneously with the channel protective film 21.

<Source Line/Source Electrode Formation Step>

Thereafter, for example, a titanium film (thickness: 30 nm to 150 nm), an aluminum film (thickness: about 50 nm to 400 nm), etc. are sequentially formed by a sputtering method on the entire substrate on which the oxide semiconductor layer 13 has been formed.

Figure 5D:
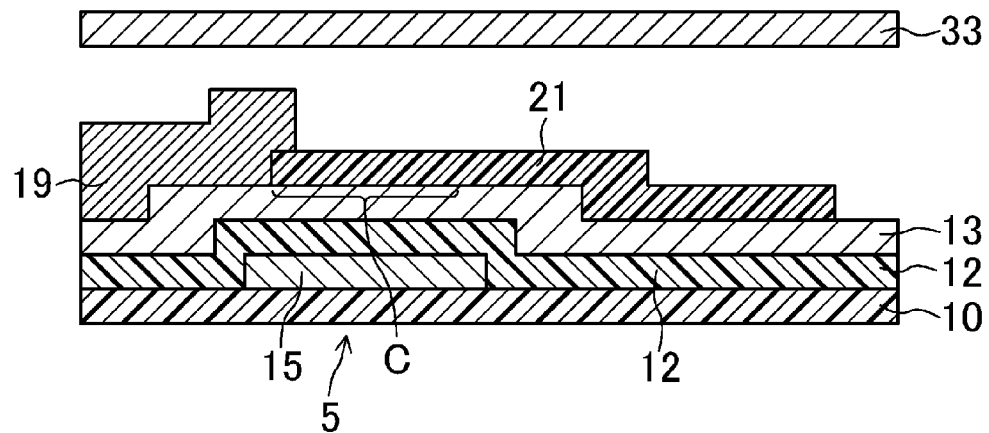

Then, resist patterning, wet etching of the aluminum film, dry etching (plasma etching) of the titanium film, and resist delamination and cleaning are performed by photolithography using a third photomask 33 having a predetermined pattern shape. A source electrode 19, which is formed by a stacked film of a first conductive layer comprised of the titanium film and a second conductive layer comprised of the aluminum film, is thus formed on the oxide semiconductor layer 13 as shown in FIG. 5D. At this time, a source line 16 and a source terminal 20, which are formed by the stacked film of the first conductive layer comprised of the titanium film and the second conductive layer comprised of the aluminum film, are formed as shown in FIGS. 1 and 2.

Either the dry etching or the wet etching may be used as the etching process, the dry etching is preferable when processing a substrate with a large area. A fluorine gas such as $CF_4$, $NF_3$, $SF_6$, or $CHF_3$, a chlorine gas such as $Cl_2$, $BCl_3$, $SiCl_4$, or $CCl_4$, an oxygen gas, etc. can be used as an etching gas, and an inert gas such as a helium or argon may be added to the etching gas.

<Interlayer Insulating Film Formation Step>

Figure 6A:
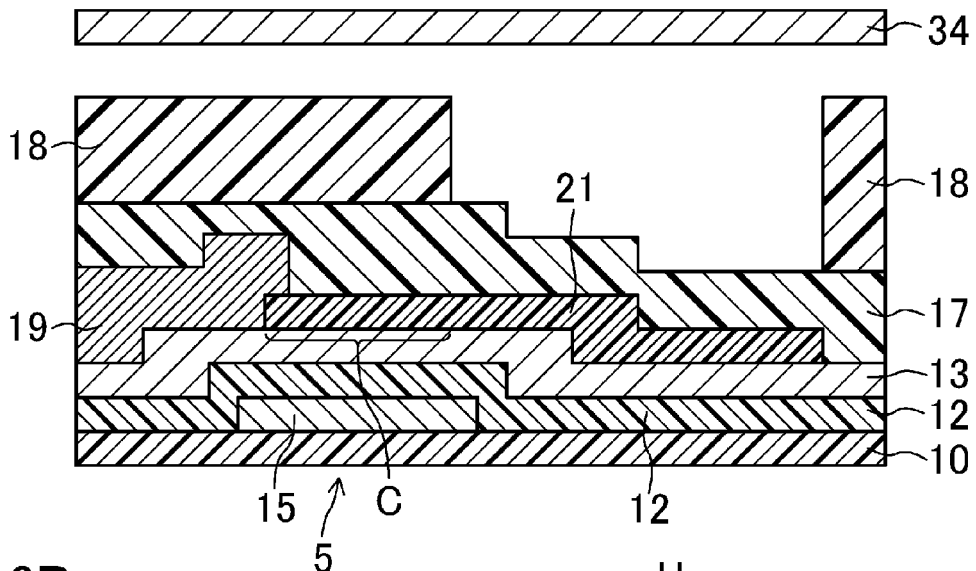
FIGS. 6A-6C are illustrations showing in section the manufacturing process of the thin film transistor substrate according to the embodiment of the present invention.

Thereafter, for example, a silicon nitride film, a silicon oxide film, a silicon nitride oxide film, etc. is formed by a plasma CVD method on the entire substrate on which the source electrode 19 and the source line 16 have been formed. Then, as shown in FIG. 6A, an interlayer insulating film 17 is formed with a thickness of about 250 nm so as to cover the oxide semiconductor layer 13, the channel protective film 21, the source electrode 19, and the source line 16. The interlayer insulating film 17 is not limited to the single layer structure, and may have a two-layer structure or a three-layer structure.

Figure 7C:
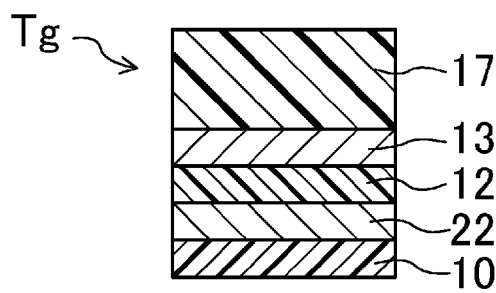

As shown in FIG. 7C, in the gate driver region Tg where the gate terminal 22 has been formed, the gate insulating film 12, the oxide semiconductor layer 13, and the interlayer insulating film 17 are sequentially stacked on the gate terminal 22 formed on the insulating substrate 10, as a result of forming the interlayer insulating film 17 in this step.

<Planarizing Film Formation Step>

Subsequently, the entire substrate on which the interlayer insulating film 17 has been formed is coated with a photosensitive organic insulating film comprised of a photosensitive acrylic resin etc. with a thickness of about 1.0 μm to 3.0 μm by a spin coating process or a slit coating process.

Then, the organic insulating film is subjected to resist patterning, exposure and development, and resist delamination and cleaning by photolithography using a fourth photomask 34 having a predetermined pattern shape. A planarizing film 18 having an opening in a portion corresponding to an opening H is thus formed on the surface of the interlayer insulating film 17, as shown in FIG. 6.

<Opening Formation Step>

Figure 6B:
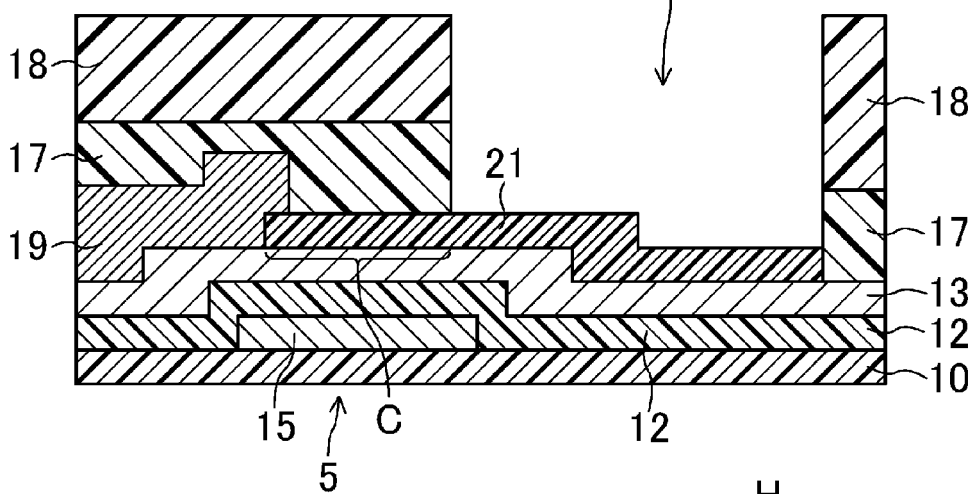

Thereafter, dry etching is performed with a predetermined etching gas (e.g., $CF_4$ gas and $O_2$ gas) by using the planarizing film 18 as a mask, thereby removing a part of the interlayer insulating film 17. The opening H is thus formed in the interlayer insulating film 17 and the planarizing film 18, as shown in FIG. 6B.

At this time, in order to avoid the disadvantage that the oxide semiconductor layer 13 in the channel region C may be etched in the subsequent oxide semiconductor layer removal step, the etching process is performed so that the channel protective film 21 forming the bottom of the opening H has a thickness of 50 nm or more.

Figure 7D:
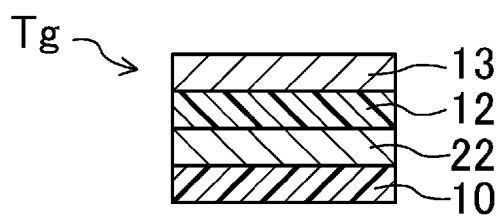

In this step, in the gate driver region Tg where the gate terminal 22 has been formed, the interlayer insulating film 17 formed on the oxide semiconductor layer 13 is removed by performing the above dry etching process using the planarizing film 18 as a mask, as shown in FIG. 7D.

<Oxide Semiconductor Layer Removal Step>

Figure 7E:
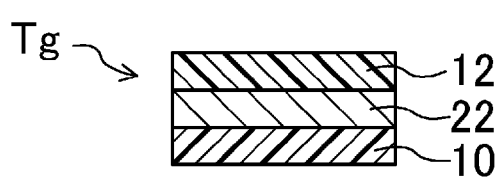

Subsequently, etching is performed with oxalic acid by using the interlayer insulating film 17 and the planarizing film 18 as a mask. The oxide semiconductor layer 13 formed on the gate insulating film 12 is thus removed in the gate driver region Tg where the gate terminal 22 has been formed, as shown in FIG. 7E.

As shown in FIG. 6B, since the channel protective film 21 is provided at the bottom of the opening H, the oxide semiconductor layer 13 in the opening H is not removed in this step.

As described above, in the present embodiment, the oxide semiconductor layer 13 is not subjected to resist patterning, wet etching, and resist delamination and cleaning by photolithography using a photomask. Since the oxide semiconductor layer 13 is formed in the entire display region D, an opening is formed in a part of the gate line 11 (i.e., a part E shown in FIG. 2) so that a part of the oxide semiconductor layer 13 is removed by the above etching process, in order to prevent a source signal, which is input to drive the thin film transistor 5, from being transmitted from an adjoining pixel via the gate line 11.

<Channel Protective Film Removal Step>

Figure 6C:
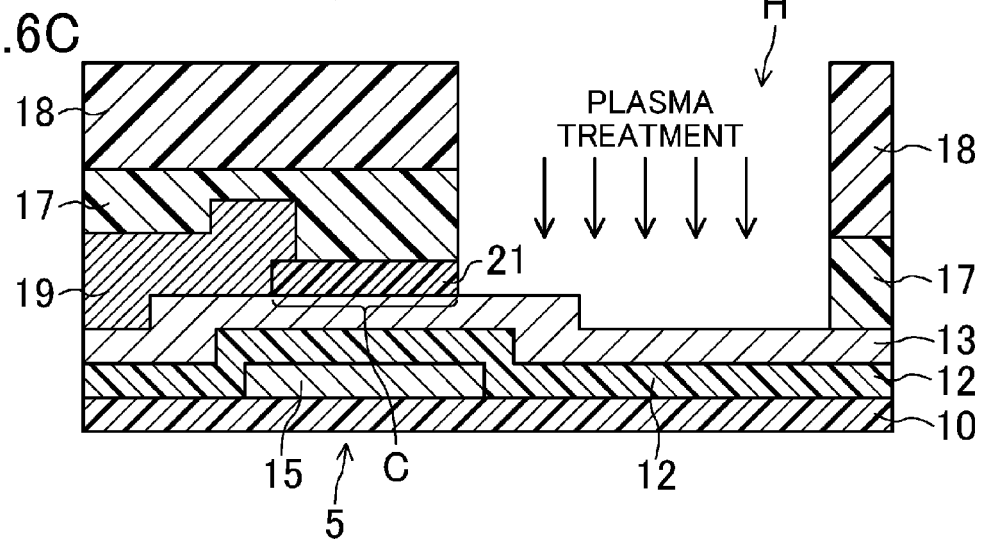
Figure 7F:
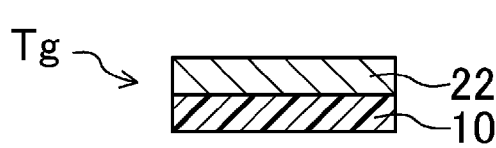

Thereafter, dry etching is performed with a predetermined etching gas (e.g., $CF_4$ gas and $O_2$ gas) by using the interlayer insulating film 17 and the planarizing film 18 as a mask, thereby removing the channel protective film 21 in the opening H, as shown in FIG. 6C, and removing the gate insulating film 12 formed on the gate terminal 22 in the gate driver region Tg where the gate terminal 22 has been formed, as shown in FIG. 7F.

<Plasma Treatment Step>

Subsequently, the oxide semiconductor layer 13 in the opening H is subjected to a reducing plasma treatment to reduce the resistance of a part of the oxide semiconductor layer 13, so that a part of the oxide semiconductor layer 13 in the opening H functions as a drain electrode 13a and another part of the oxide semiconductor layer 13 in the opening H functions as a pixel electrode 13b. The thin film transistor substrate 1 shown in FIGS. 1-4 is fabricated in this manner.

For example, a rare gas plasma treatment using Ar, He, etc., a hydrogen plasma treatment, or a treatment of exposing to plasma containing at least one element of B, Al, Ga, In, and F is performed as the reducing plasma treatment. Performing this reducing plasma treatment on the oxide semiconductor layer 13 in the opening H reduces oxygen in the oxide semiconductor layer 13, whereby the oxide semiconductor layer 13 has a property of a metal film. Thus, the resistance of the oxide semiconductor layer 13 is reduced.

As described above, in the present embodiment, the thin film transistor substrate 1 can be fabricated by using four photomasks (i.e., the first to fourth photomasks 31 to 34).

The following advantages can be obtained by the embodiment described above.

(1) The present embodiment is configured to include the steps of: forming the gate electrode 15 on the insulating substrate 10 by using the first photomask 31; forming the oxide semiconductor layer 13 on the gate insulating film 12; forming the channel protective film 21 on the oxide semiconductor layer 13 by using the second photomask 32 so that the channel protective film 21 covers the channel region C; forming the source electrode 19 on the oxide semiconductor layer 13 by using the third photomask 33; and forming the planarizing film 18 on the interlayer insulating film 17 by using the fourth photomask 34. The present embodiment is configured to further include the steps of: removing a part of the interlayer insulating film 17 by using the planarizing film 18 as a mask; forming the opening H in the interlayer insulating film 17 and the planarizing film 18; removing the channel protective film 21 in the opening H by etching by using the interlayer insulating film 17 and the planarizing film 18 as a mask; and plasma treating the oxide semiconductor layer 13 in the opening H. Since the thin film transistor substrate 1 can be manufactured by using fewer masks (four masks) than the related art described above, manufacturing cost can be reduced, and reduction in yield can be effectively suppressed.

A halftone exposure technique is commonly used as a technique for reducing the number of steps in a manufacturing process. In the halftone exposure technique, however, as the area of a half exposure region decreases, it becomes difficult to provide a difference in area between unexposed and exposed regions, and it is therefore difficult to form fine patterns. Since the halftone exposure technique is not used in the present embodiment, the thin film transistor substrate 1 can be manufactured by using fewer masks (four masks) than the related art described above, without causing difficulty in forming fine patterns.

(2) The present embodiment is configured to use a reducing plasma treatment as the plasma treatment in the plasma treatment step. This allows the drain electrode 13a and the pixel electrode 13b to be formed in the oxide semiconductor layer 13 by a simple method without using a separate mask.

(3) The present embodiment is configured to form the oxide semiconductor layer 13 from indium gallium zinc oxide (IGZO). This allows the thin film transistor 5 to have satisfactory characteristics such as high mobility and a low off-state current.

The above embodiment may be modified as follows.

Figure 8:
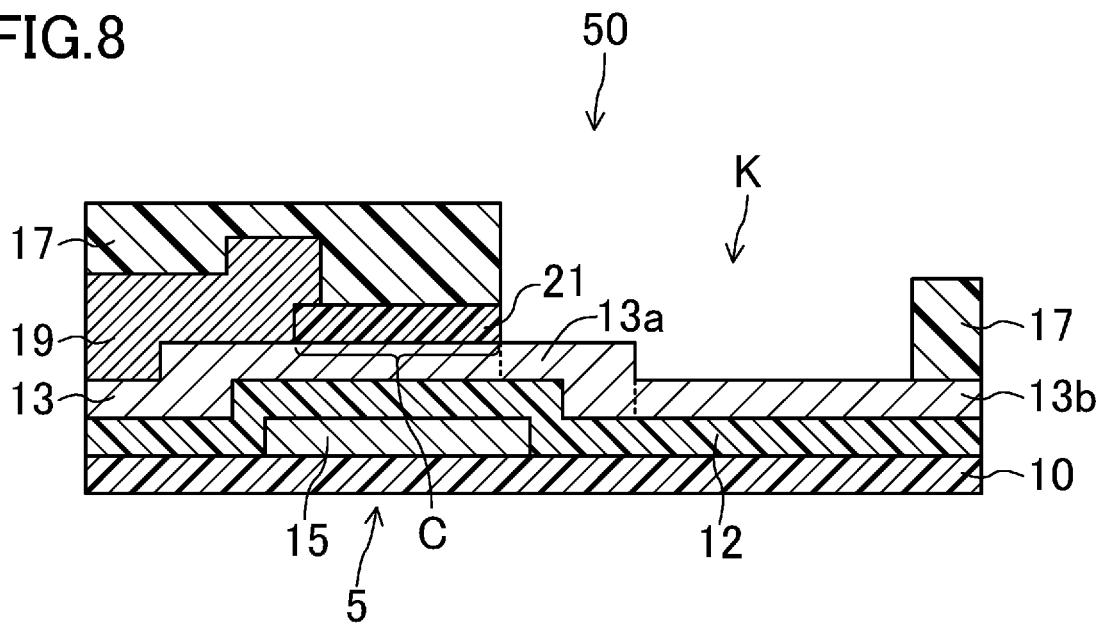
FIG. 8 is a sectional view of a thin film transistor substrate according to a modification of the present invention.

The above embodiment is configured to include the planarizing film 18. However, as shown in FIG. 8, a thin film transistor substrate 50 may not include the planarizing film 18, and the thin film transistor substrate 50 may be manufactured by using the interlayer insulating film 17 as a mask.

In this case, first, in the thin film transistor substrate fabrication process, the gate electrode/gate line formation step, the gate insulating film formation step, the semiconductor layer formation step, the channel protective film formation step, and the source line/source electrode formation step are performed by using the first to third photomasks 31 to 33, in a manner similar to that of FIGS. 5A-5D described in the above embodiment.

Figure 9:
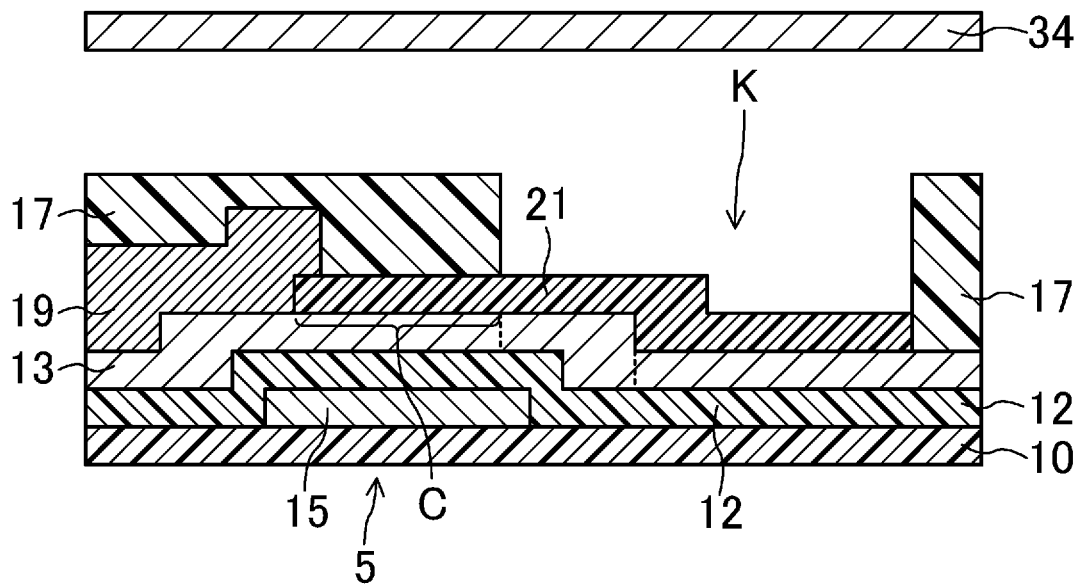
FIG. 9 is an illustration showing in section a manufacturing process of the thin film transistor substrate according to the modification of the present invention.

Next, as shown in FIG. 9, as the interlayer insulating film formation step, a film such as, e.g., a silicon nitride film, a silicon oxide film, a silicon nitride oxide film, etc. is formed by a plasma CVD method on the entire substrate on which the source electrode 19 and the source line 16 have been formed.

Then, the silicon nitride film etc. is subjected to resist patterning, exposure and development, and resist delamination and cleaning by photolithography using the fourth photomask 34 having a predetermined pattern shape, thereby forming the interlayer insulating film 17 covering the oxide semiconductor layer 13, the channel protective film 21, the source electrode 19, and the source line 16 and having an opening K.

Subsequently, in a manner similar to that of FIG. 6C described in the above embodiment, as the channel protective film removal step, dry etching is performed with a predetermined etching gas (e.g., $CF_4$ gas and $O_2$ gas) by using the interlayer insulating film 17 as a mask, thereby removing the channel protective film 21 in the opening K.

Thereafter, in a manner similar to that of FIG. 6C described in the above embodiment, the oxide semiconductor layer 13 in the opening K is subjected to a reducing plasma treatment to reduce the resistance of a part of the oxide semiconductor layer 13, so that a part of the oxide semiconductor layer 13 in the opening K functions as the drain electrode 13a and another part of the oxide semiconductor layer 13 in the opening K functions as the pixel electrode 13b. The thin film transistor substrate 50 shown in FIG. 8 is fabricated in this manner.

Although the oxide semiconductor layer 13 comprised of indium gallium zinc oxide (IGZO) is used as the oxide semiconductor layer in the above embodiment, the oxide semiconductor layer 13 is not limited to this. For example, a metal oxide material containing at least one of indium (In), gallium (Ga), aluminum (Al), copper (Cu), zinc (Zn), magnesium (Mg), and cadmium (Cd) may be used as an oxide semiconductor material.

Since the oxide semiconductor layer 13 comprised of such an oxide semiconductor material has high mobility even if it is amorphous, the on-state resistance of the switching element can be increased. This increases the difference in output voltage in a data read operation, and can improve the S/N ratio.

Examples of the semiconductor oxide film include $InGaO_3(ZnO)_5$, $Mg_xZn_{1-x}O$, $Cd_xZn_{1-x}O$, and CdO, in addition to IGZO (In—Ga—Zn—O).

Although the oxide semiconductor layer is used as a semiconductor layer in the above embodiment, the semiconductor layer is not limited to this. For example, a silicon semiconductor layer comprised of amorphous silicon or polysilicon may be used as the semiconductor layer of the thin film transistor, instead of the oxide semiconductor layer.

INDUSTRIAL APPLICABILITY

The present invention is applicable to, e.g., a method of manufacturing a thin film transistor substrate using a semiconductor layer of an oxide semiconductor, and a thin film transistor substrate manufactured by the same.

DESCRIPTION OF REFERENCE CHARACTERS

1 Thin Film Transistor Substrate
5 Thin Film Transistor
10 Insulating Substrate
11 Gate Line
12 Gate Insulating Film
13 Oxide Semiconductor Layer
13a Drain Electrode
13b Pixel Electrode
15 Gate Electrode
16 Source Line
17 Interlayer Insulating Film
18 Planarizing Film 19 Source Electrode
20 Source Terminal
21 Channel Protective Film
22 Gate Terminal
25 Protective Layer
31 First Photomask
32 Second Photomask
33 Third Photomask
34 Fourth Photomask
50 Thin Film Transistor Substrate
C Channel Region
H Opening
K Opening

The invention claimed is:

1. A method of manufacturing a thin film transistor substrate that includes an insulating substrate, a thin film transistor including a gate electrode provided on the insulating substrate, a gate insulating film provided so as to cover the gate electrode, an oxide semiconductor layer provided on the gate insulating film and including a channel region, and a source electrode provided on the oxide semiconductor layer so as to overlap the gate electrode, a channel protective film provided so as to cover the channel region, an interlayer insulating film provided so as to cover the thin film transistor, and a planarizing film provided so as to cover the interlayer insulating film, the method comprising at least:

a gate electrode formation step of forming the gate electrode on the insulating substrate by using a first photomask;

a gate insulating film formation step of forming the gate insulating film over the insulating substrate so as to cover the gate electrode;

a semiconductor layer formation step of forming the oxide semiconductor layer on the gate insulating film;

a channel protective film formation step of forming the channel protective film on the oxide semiconductor layer so as to cover the channel region by using a second photomask;

a source electrode formation step of forming the source electrode on the oxide semiconductor layer by using a third photomask;

an interlayer insulating film formation step of forming the interlayer insulating film covering the oxide semiconductor layer, the channel protective film, and the source electrode;

a planarizing film formation step of forming the planarizing film on the interlayer insulating film by using a fourth photomask;

an opening formation step of forming an opening in the interlayer insulating film and the planarizing film by removing a portion of the interlayer insulating film by using the planarizing film as a mask;

a channel protective film removal step of removing the channel protective film in the opening by performing etching by using the interlayer insulating film and the planarizing film as a mask to expose a portion of a surface of the oxide semiconductor layer from the channel protection film; and a plasma treatment step of plasma treating the oxide semiconductor layer in the opening to reduce a resistance of a portion of the oxide semiconductor layer.

2. A method of manufacturing a thin film transistor substrate that includes an insulating substrate, a thin film transistor including a gate electrode provided on the insulating substrate, a gate insulating film provided so as to cover the gate electrode, an oxide semiconductor layer provided on the gate insulating film and including a channel region, and a source electrode provided on the oxide semiconductor layer so as to overlap the gate electrode, a channel protective film provided so as to cover the channel region, and an interlayer insulating film provided so as to cover the thin film transistor, the method comprising at least:

a gate electrode formation step of forming the gate electrode on the insulating substrate by using a first photomask;

a gate insulating film formation step of forming the gate insulating film over the insulating substrate so as to cover the gate electrode;

a semiconductor layer formation step of forming the oxide semiconductor layer on the gate insulating film;

a channel protective film formation step of forming the channel protective film on the oxide semiconductor layer so as to cover the channel region by using a second photomask;

a source electrode formation step of forming the source electrode on the oxide semiconductor layer by using a third photomask;

an interlayer insulating film formation step of forming the interlayer insulating film covering the oxide semiconductor layer, the channel protective film, and the source electrode and including an opening by using a fourth photomask;

a channel protective film removal step of removing the channel protective film in the opening by performing etching by using the interlayer insulating film as a mask to expose a portion of a surface of the oxide semiconductor layer from the channel protective film; and a plasma treatment step of plasma treating the oxide semiconductor layer in the opening to reduce a resistance of a portion of the oxide semiconductor layer.

3. The method of claim 1, wherein the plasma treatment is a reducing plasma treatment.

4. The method of claim 1, wherein an oxide semiconductor material forming the oxide semiconductor layer is a metal oxide material containing at least one selected from the group consisting of indium (In), gallium (Ga), aluminum (Al), copper (Cu), and zinc (Zn).

5. The method of claim 4, wherein the oxide semiconductor material is indium gallium zinc oxide (IGZO).

6. A thin film transistor substrate manufactured by the method of claim 1.

7. The method of claim 1, wherein in the plasma treatment step, the plasma treatment is performed such that the portion of the oxide semiconductor layer functions as a drain electrode and a pixel electrode.

8. The method of claim 2, wherein the plasma treatment is a reducing plasma treatment.

9. The method of claim 2, wherein an oxide semiconductor material forming the oxide semiconductor layer is a metal oxide material containing at least one selected from the group consisting of indium (In), gallium (Ga), aluminum (Al), copper (Cu), and zinc (Zn).

10. The method of claim 9, wherein the oxide semiconductor material is indium gallium zinc oxide (IGZO).

11. A thin film transistor substrate manufactured by the method of claim 2.

12. The method of claim 2, wherein
in the plasma treatment step, the plasma treatment is performed such that the portion of the oxide semiconductor layer functions as a drain electrode and a pixel electrode.

* * * * *